United States Patent
Lin (10) Patent No.: US 10,593,407 B2
(45) Date of Patent: Mar. 17, 2020

(54) FAST PROGRAMMING METHODS FOR FLASH MEMORY DEVICES

(71) Applicant: Winbond Electronics Corp., Taichung (TW)

(72) Inventor: Hung-Hsueh Lin, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 21 days.

(21) Appl. No.: 16/117,406

(22) Filed: Aug. 30, 2018

(65) Prior Publication Data

US 2019/0066795 A1    Feb. 28, 2019

(30) Foreign Application Priority Data

Aug. 31, 2017  (CN) .......................... 2017 1 0783560

(51) Int. Cl.
*G11C 8/06* (2006.01)
*G11C 16/10* (2006.01)
(Continued)

(52) U.S. Cl.
CPC ............ *G11C 16/10* (2013.01); *G11C 7/1021* (2013.01); *G11C 8/06* (2013.01); *G11C 11/2255* (2013.01); *G11C 11/5628* (2013.01); *G11C 16/105* (2013.01); *G11C 16/24* (2013.01); *G11C 16/3459* (2013.01); *G11C 7/1009* (2013.01); *G11C 16/0483* (2013.01); *G11C 2207/2263* (2013.01); *G11C 2211/5621* (2013.01)

(58) Field of Classification Search
CPC ... G11C 16/10; G11C 7/1021; G11C 11/2255; G11C 11/5628; G11C 16/3459; G11C 7/1009; G11C 8/06
See application file for complete search history.

(56) References Cited

U.S. PATENT DOCUMENTS 5,557,572 A * 9/1996 Sawada ................... G11C 16/10
                                                 365/185.22
5,966,332 A * 10/1999 Takano ............... G11C 11/5621
                                                 365/185.29
(Continued)

FOREIGN PATENT DOCUMENTS

TW          I493459          7/2015
TW          I587302          6/2017

*Primary Examiner* — Huan Hoang
*Assistant Examiner* — Jay W. Radke
(74) *Attorney, Agent, or Firm* — Muncy, Geissler, Olds & Lowe, P.C.

(57) ABSTRACT

A byte-programming method for programming data from a page register to a non-volatile memory array includes reading data of a selected byte in the page register and programming the data to the memory cells of the non-volatile memory corresponding to a selected column address; determining whether to update an array column address according to the selected column address, which includes: determining whether the data of the selected byte matches specified content; when the data of the selected byte matches the specified content, not updating the array column address; and when the data of the selected byte does not match the specified content, updating the array column address according to the selected column address; and determining whether the selected column address is the last column address.

9 Claims, 4 Drawing Sheets

(51) Int. Cl.
 G11C 11/56 (2006.01)
 G11C 11/22 (2006.01)
 G11C 7/10 (2006.01)
 G11C 16/34 (2006.01)
 G11C 16/24 (2006.01)
 G11C 16/04 (2006.01)

(56) References Cited

U.S. PATENT DOCUMENTS

| | | | |
|---|---|---|---|
| 7,298,642 B2* | 11/2007 | Ise | G11C 11/16 365/148 |
| 8,675,410 B2 | 3/2014 | Pyeon | |
| 9,690,650 B2 | 6/2017 | Liu | |
| 9,947,404 B1* | 4/2018 | Park | G11C 13/0069 |
| 2006/0044875 A1 | 3/2006 | Ahn | |
| 2006/0106969 A1* | 5/2006 | Hoogerbrugge | G06F 13/1631 711/1 |
| 2007/0053224 A1* | 3/2007 | Happ | G11C 13/0011 365/185.17 |
| 2009/0046522 A1* | 2/2009 | Sepe | G11C 16/10 365/189.16 |
| 2011/0255339 A1 | 10/2011 | Kim | |
| 2015/0106554 A1* | 4/2015 | Balakrishnan | G11C 7/1006 711/103 |
| 2018/0068704 A1* | 3/2018 | Shimizu | G11C 11/1675 |

* cited by examiner

FAST PROGRAMMING METHODS FOR FLASH MEMORY DEVICES

CROSS REFERENCE TO RELATED APPLICATIONS

This Application claims priority of China Patent Application No. 201710783560.2, filed on Aug. 31, 2017, the entirety of which is incorporated by reference herein.

BACKGROUND OF THE INVENTION

Field of the Invention

The disclosure relates generally to programming methods of a non-volatile memory device, and more particularly relates to fast programming methods of a flash memory device operated in a low voltage.

Description of the Related Art

One byte or bytes of data is allowed to be programmed to memory cells corresponding to a previously erased page address of a flash memory while page-programming. Programming cycles are in progress till all the data in a selected page is correctly written into the corresponding location. In order to reduce the time for page-programming and to ensure the integrity of the data, it is required to determine whether the page-programming should be executed or not and to verify whether the data stored in the programmed cell has been written correctly.

For the sake of satisfying the requirement of fast page-programming, the efficiency of a pump circuit in the flash memory which is operated in low voltage will drop dramatically. During the process of fast page-programming, the pump circuit consumes a lot of current due to high-voltage signal switching for switching, for example, word lines and bit lines. The current caused by switching bit lines is more critical in low voltage application so that we need a pump circuit with a higher driving capability and a faster recovery time.

However, increasing the driving capability or reducing the recovery time of the pump circuit would result in higher costs. Therefore, a more effective method for fast-programming is required to effectively reduce the current consumption and mitigate the burden on the pump circuit.

BRIEF SUMMARY OF THE INVENTION

In an embodiment, a byte-programming method configured to program data from a page register to a non-volatile memory array comprises: reading data of a selected byte in the page buffer and programming the data of the byte to memory cells corresponding to a selected column address in the non-volatile memory array; determining whether to update an array column address according to the selected column address, comprising: determining whether the data of the selected byte matches specific content; when the data of the selected byte matches the specific content, not updating the array column address; and when the data of the selected byte does not match the specific content, updating the array column address according to the selected column address; and determining whether the selected column address is the last column address.

In an embodiment, a page-programming method configured to program data of a page stored in a page register to a non-volatile memory array comprises: executing a verify process, wherein the verify process comprises: reading the data of a selected byte in the page register and programming the data of the selected byte to memory cells corresponding to a selected column address in the non-volatile memory array; determining whether the data of the selected byte matches specific content; when the data of the selected byte does not match the specific data, updating an array column address according to the selected column address, reading data of the memory cells corresponding to the selected column address in the non-volatile memory array, comparing the data of the memory cells corresponding to the selected column address with the data of the selected byte to generate comparison data, and programming the comparison data back to the selected byte; when the data of the selected byte matches the specific content, not updating the array column address; and determining whether the selected column address is the last column address, and determining whether all the comparison data corresponding to the page matches the specific content when the selected column address is the last column address; and when any one of the comparison data does not match the specific content, executing a program process.

A detailed description is given in the following embodiments with reference to the accompanying drawings.

DETAILED DESCRIPTION OF THE INVENTION

The present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 1:
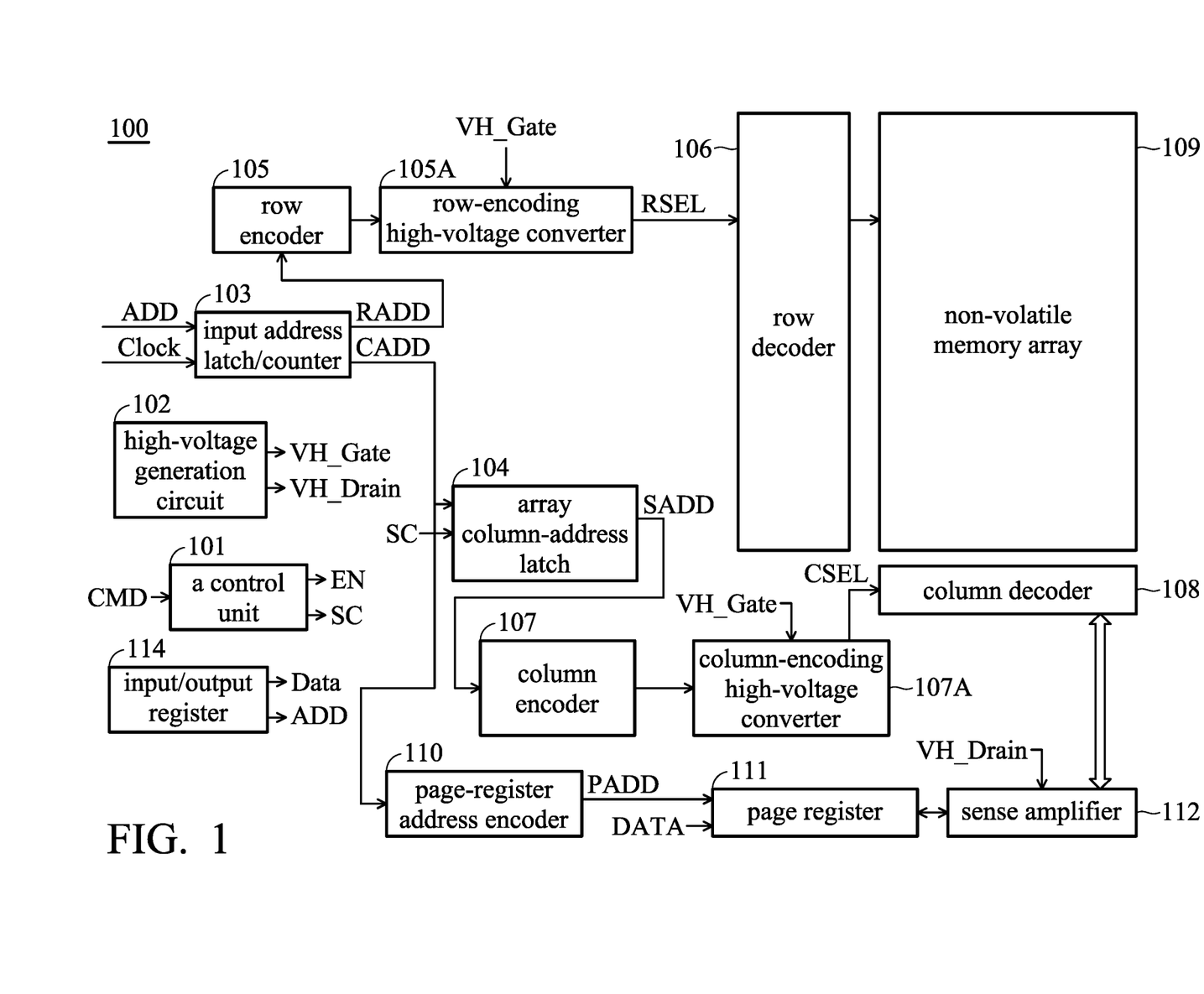
FIG. 1 is a block diagram of a non-volatile memory device in accordance with an embodiment of the invention.

FIG. 1 is a block diagram of a non-volatile memory device in accordance with an embodiment of the invention. As shown in FIG. 1, the non-volatile memory device 100 includes a control unit 101, a high-voltage generation circuit 102, an input address latch/counter 103, an array column-address latch 104, a row encoder 105, a row-encoding high-voltage converter 105A, a row decoder 106, a column encoder 107, a column-encoding high-voltage converter 107A, a column decoder 108, a non-volatile memory array 109, a page register address encoder 110, a page register 111, a sense amplifier 112, and an input/output register 114.

According to an embodiment of the invention, when the control unit 101 receives a program command CMD, the control unit 101 enables the high-voltage generation circuit 102 via an enable signal EN, such that the high-voltage generation circuit 102 generates a gate voltage VH_Gate and a drain voltage VH_Drain. The input address latch/counter 103 receives and latches an input address ADD from the input/output register 114, and divides the input address ADD into a row address RADD and a column address CADD. The row address RADD is transmitted to the row encoder 105, and the column address CADD is transmitted to the array column-address latch 104 and the page-register address encoder 110. The array column-address latch 104 updates an array column address SADD to be the column address CADD according to a control signal SC from the control unit 101, and transmits the array column address SADD to the column encoder 107. The page-register address encoder 110 encodes the column address CADD to be a page-register address PADD. The page register 111 receives the page-register address PADD and the write data Data from the input/output register 114.

The row encoder 105 is coupled to the row-encoding high-voltage converter 105A, while the column encoder 107 is coupled to the column-encoding high-voltage converter 107A. The gate voltage VH_Gate is provided to the row-encoding high-voltage converter 105A and the column-encoding high-voltage converter 107A to generate the row-address selection signal RSEL and the column-address selection signal CSEL. The row decoder 106 and the column decoder 108 respectively select the memory cells of the non-volatile memory array 109 corresponding to the input address ADD according to the row-address selection signal RSEL and the column-address selection signal CSEL.

According to an embodiment of the invention, the control unit 101 utilizes the control signal SC to control the array column-address latch 104 to unlatch the array column address SADD. The array column-address latch 104 is then updated to latch the column address CADD such that the sense amplifier 112, according to the array column address SADD, programs the data of the byte in the page register 111 corresponding to the page-register address PADD which corresponds to the input address ADD to the memory cells corresponding to the column address CADD in the non-volatile memory array 109.

According to an embodiment of the invention, the non-volatile memory array 109 may be a flash memory array. According to an embodiment of the invention, the page register 111 may be a static random-access memory (SRAM). According to other embodiments of the invention, the page register 111 may be any other type of memory or register.

Figure 2:
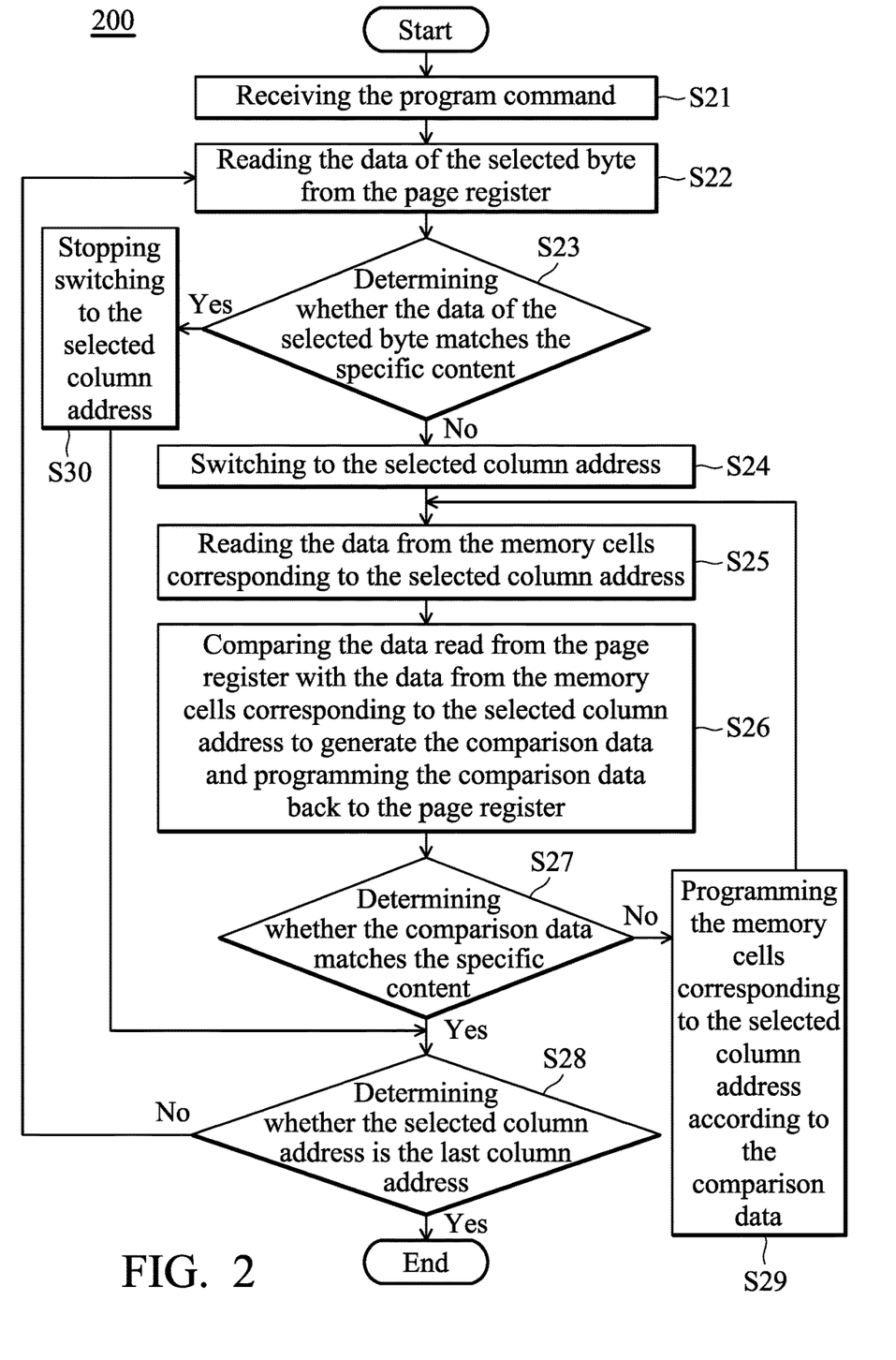
FIG. 2 is a flow chart of a byte-programming method in accordance with an embodiment of the invention.

FIG. 2 is a flow chart of a byte-programming method in accordance with an embodiment of the invention. By the byte-programming method 200 in FIG. 2, the page stored in the page register 111 can be programmed to the non-volatile memory array 109 byte-by-byte. The following description will be accompanied with FIG. 1.

As shown in FIG. 2, when the control unit receives the program command CMD (Step S21), the page-register address encoder 110 generates the selected page-register address PADD according to the selected column address CADD. The control unit 101 reads the data of the selected byte from the page register 111 according to the selected page-register address PADD (Step S22).

Then, the control unit 101 determines whether the data of the selected byte matches the specific content (Step S23). According to an embodiment of the invention, the specific content is FF in hexadecimal. Namely, each bit of the selected byte data is logic 1, which indicates that the selected byte need not be programmed.

When the control unit 101 determines that the data of the selected byte does not match the specific content, the control unit 101 updates the array column address SADD in the array column-address latch 104 to be the selected column address CADD by the control signal SC, such that the array column-address latch 104 outputs the array column address SADD which equals to the selected column address CADD. In some embodiments, when the array column-address latch 104 has latched a column address, and when the control unit 101 determines the data of the selected byte does not match the specific content, the array column-address latch 104 is unlatched and receives the selected column address CADD to output the array column address SADD (Step S24). Then, the column encoder 107 receives the array column address SADD and outputs the corresponding column-address selection signal CSEL through the column-encoding high-voltage converter 107A. The sense amplifier 112 is configured to read the data from the memory cells corresponding to the array column address SADD in the non-volatile memory array 109 according to the corresponding column-address selection signal CSEL (Step S25).

The control unit 101 then compares the data from the memory cells corresponding to the array column address SADD with the data of the selected byte in the page register 111 to generate the comparison data, and programs the comparison data back to the selected byte of the page register 111 (Step S26). According to an embodiment of the invention, the comparison data indicates that which bits in the memory cells corresponding to the array column address SADD (selected array column address) should be programmed.

The control unit 101 then determines whether the comparison data matches the specific content (Step S27). When the comparison data matches the specific content, it indicates that the memory cells corresponding to the array column address SADD should not be programmed. Therefore, the control unit 101 determines whether the selected column address CADD is the last column address (Step S28).

According to an embodiment of the invention, when the control unit 101 determines that the selected column address CADD is the last column address, the byte-programming method 200 ends. When the control unit 101 determines that the selected column address CADD is not the last column address, the input address latch/counter 103 moves to the next column address by the input clock Clock and Step S22 is then executed again. The selected byte corresponding to the next column address is continuously read from the page register 111.

Back to Step S27, when the comparison data does not match the specific content, it indicates that the memory cells corresponding to the array column address SADD should be programmed. Therefore, the control unit 101 then programs the memory cells corresponding to the array column address SADD according to the comparison data (Step S29). Then, the sense amplifier 112 once again reads the data from the memory cells corresponding to the array column address SADD (Step S25) and the data of the memory cells corresponding to the array column address SADD is once again compared with the data of the selected byte in the page register 111 to generate the comparison data and to program the comparison data back to the selected byte (Step S26), until it is determined that the comparison data matches the specific content in Step S27.

According to an embodiment of the invention, when Step S25 to Step S27 are repeated for a predetermined number of times, the memory cells corresponding to the selected array column address is prevented or stopped being programmed even though it is still determined that the comparison data does not match the specific content in Step S27.

Back to Step S23, when the control unit 101 determines that the data of the selected byte matches the specific content, the control unit 101 uses the control signal SC to control the array column latch 104 to continuously latch the current column address (Step S30). Namely, the array column address SADD is not updated to the selected column address CADD. In other words, the control unit 101 does not program the memory cells corresponding to the selected column address in the non-volatile memory array 109 and the byte-programming method 200 goes to Step S28 to determine whether the selected column address is the last column address.

According to an embodiment of the invention, when the data of the selected byte matches the specific content, it indicates that the memory cells corresponding to the selected column address should not be programmed. Therefore, the control unit 101 controls the array column-address latch 104 to be activated, or to remain activated, for latching the current column address such that the array column address SADD is not updated. When it is required to program the memory cells corresponding to the selected column address, the control unit 101 then controls the array column-address latch 104 to unlatch the current column address and to update the array column address SADD to be the same as the selected column address. Therefore, performance degradation due to a voltage drop of the gate voltage VH_Gate, which is induced by an instant current generated by fast-switching the array column address SADD and the row-address selection signal RSEL, can be prevented.

Since whether the non-volatile memory array 109 should be read or programmed is determined according to whether the data in the page register 111 matches the specific content in the byte-programming method 200, not only the time for the unnecessary read or program operation can be reduced, but also the stability of the gate voltage VH_Gate can be maintained by stopping switching the column address when it is determined that it is not necessary to program the non-volatile memory array 109 such that the effectiveness of data programming can be improved.

Figure 3A:
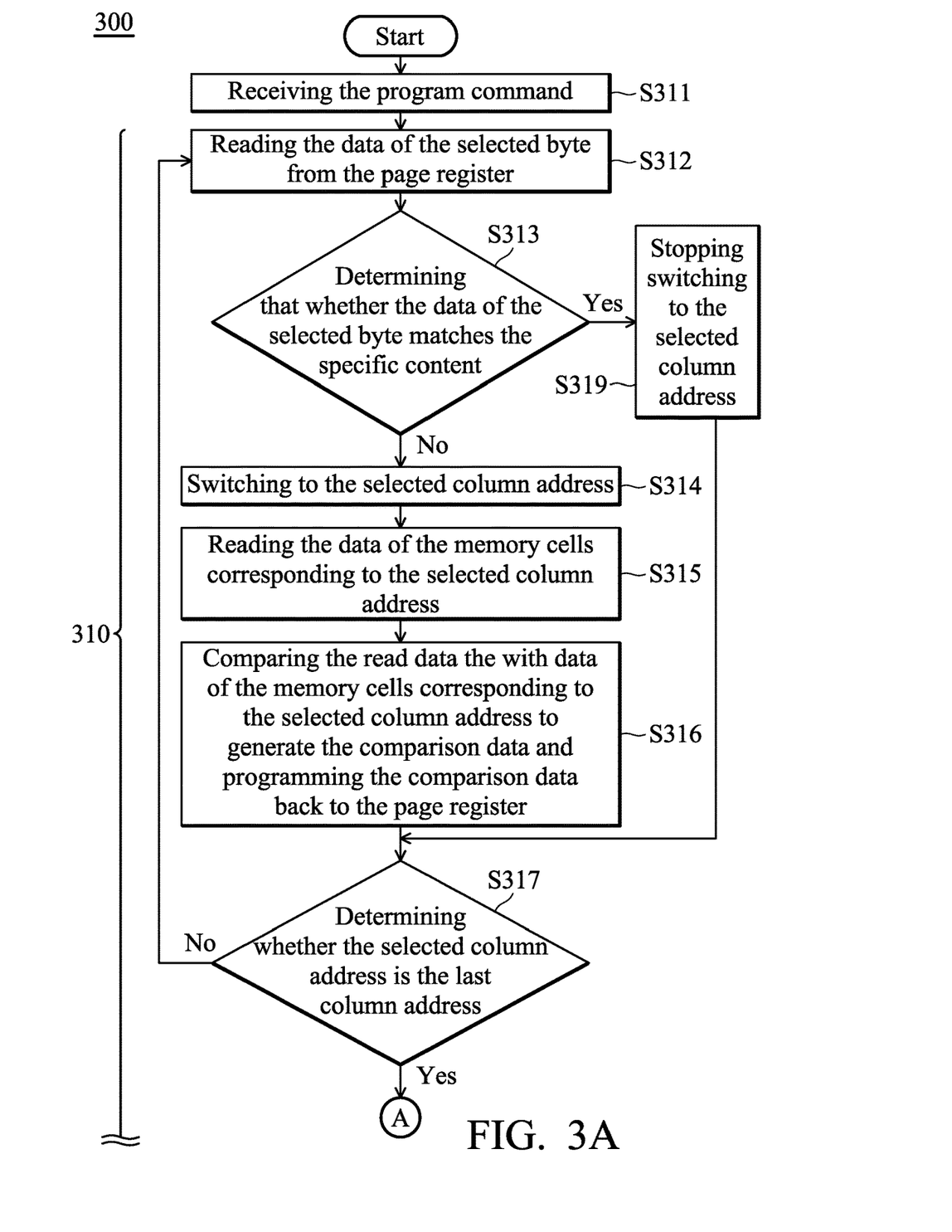
FIGS. 3A-3B show a flow chart of a page-programming method in accordance with an embodiment of the invention.
Figure 3B:
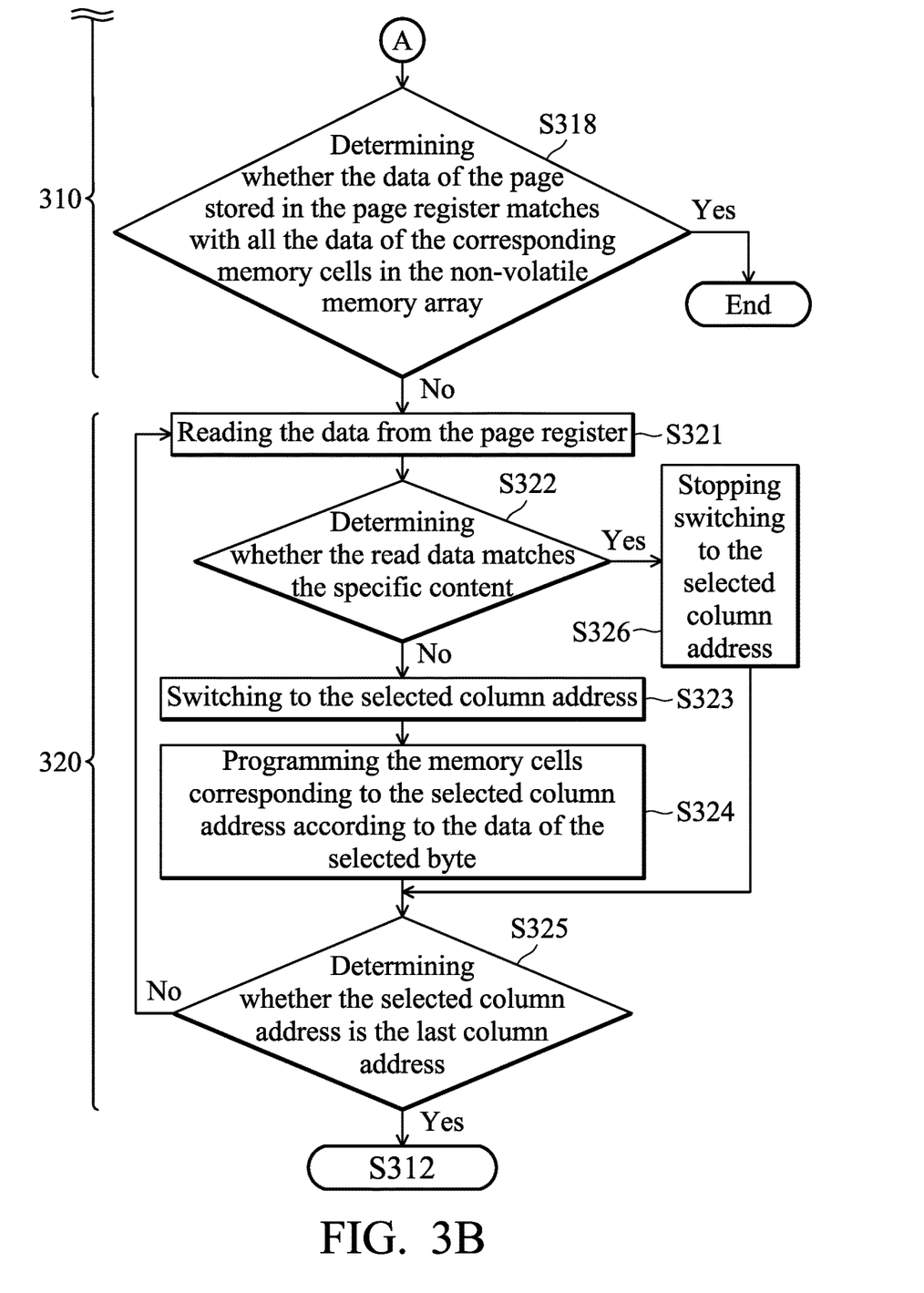

FIGS. 3A-3B show a flow chart of a page-programming method in accordance with an embodiment of the invention. The page-programming method 300 in FIGS. 3A and 3B includes a verify process 310 and a program process 320 which are configured to program the page stored in the page register 111 to the non-volatile memory array 109 page-by-page. The following description of FIGS. 3A and 3B will be accompanied with FIG. 1.

As shown in FIG. 3A, when the control unit 101 receives the program command CMD (Step S311), the control unit 101 begins executing the verify process 310.

First, the control unit 101 reads the data of the selected byte from the page register 111 (Step S312). Then, the control unit 101 determines that whether the data of the selected byte matches the specific content (Step S313). According to an embodiment of the invention, the specific content is FF in hexadecimal. Namely, the selected byte consists of logic "1" bits which indicates that it is not necessary to program the memory cells corresponding to the array column address SADD.

When the control unit 101 determines that the data of the selected byte does not match the specific content, the control unit 101 controls, using the control signal SC, the array column-address latch 104 to unlatch the current column address, such that the column address CADD is updated to be the selected column address and the array column address SADD output by the array column-address latch 104 is the selected column address (Step S314). The control unit 101 also controls the sense amplifier 112 to read the data of the memory cells corresponding to the array column address SADD in the non-volatile memory array 109 (Step S315).

Then, the control unit 101 compares the data of the memory cells corresponding to the array column address SADD with the data of the selected byte in the page register 111 to generate the comparison data, and programs the comparison data back to the selected byte of the page register 111 (Step S316). The control unit 101 then determines whether the selected column address is the last column address (Step S317). According to an embodiment of the invention, the comparison data indicates that which bits of the memory cells corresponding to the array column address SADD should be programmed.

Back to Step S313, when the control unit 101 determines that the data of the selected byte matches the specific content, the control unit 101 uses the control signal SC to control the array column-address latch 104 to remain latched to the current column address (Step S319). Namely, the array column address SADD is not updated and Step S317 is then executed to determine whether the selected column address is the last column address. When the selected column address is not the last column address, the input address latch/counter 103 moves to the next column address by the input clock Clock, and Step S312 is then executed again.

Back to Step S317, according to an embodiment of the invention, when the control unit 101 determines that the selected column address is the last column address, the control unit 101 determines whether the data of the page stored in the page register 111 matches with all the data of the corresponding memory cells in the non-volatile memory array 109 (Step S318). When all the comparison data match the specific content, the control unit 101 determines that the data of the page stored in the page register 111 matches with the data of the corresponding memory cells in the non-volatile memory array 109. Namely, the data of the page stored in the page register 111 has been successfully programmed to the corresponding memory cells in the non-volatile memory array 109. Therefore, it is not necessary to execute the program process 320, and the page-programming method 300 ends.

According to another embodiment of the invention, when the control unit 101 determines that the data of the page stored in the page register 111 does not match with the data of the corresponding memory cells in the non-volatile memory array 109 (i.e., at least one part of the comparison data does not match the specific content), it indicates that the data of the page stored in the page register 111 is not successfully programmed to the corresponding memory cells in the non-volatile memory array 109, such that the program process 320 should be executed. Before executing the program process 320, the input address latch/counter 103 is reset to output the initial column address.

When executing the program process 320, the array column-address latch 104 latches the initial column address, and the control unit 101 reads the data of the selected byte in the page register 111 (Step S321). Then, the control unit 101 determines whether the data of the selected byte matches the specific content (Step S322).

When the control unit 101 determines that the data of the selected byte does not match the specific content, the control unit 101 controls, using the control signal SC, the array column-address latch 104 to unlatch the initial column address. Therefore, the column address CADD of the input column-address latch 104 is updated to the selected column address CADD and the array column address SADD generated by the array column-address latch 104 is the selected column address CADD (Step S323). The control unit 101 uses the sense amplifier 112 to program the memory cells corresponding to the array column address SADD according to the data of the selected byte (Step S324).

Then, the control unit 101 determines whether the selected column address is the last column address (Step S325). When the selected column address is not the last column address, the input address latch/counter 103 moves to the next column address by the input clock Clock, and Step S321 is executed again. The control unit 101 reads the data of the next selected byte in the page register 111. When the selected column address is the last column address, the input address latch/counter 103 is reset to the initial column address, and Step S312 of the verify process 310 is then executed again.

Back to Step S322, when the control unit 101 determines that the data of the selected byte matches the specific content, it indicates that it is not necessary to program the memory cells corresponding to the selected column address. The control unit 101 uses the control signal SC to control the array column-address latch 104 not to update the column address CADD to the selected column address (Step S326). In some embodiments of the invention, when the array column-address latch 104 has latched a column address before receiving the selected column address, and when the control unit 101 determines that the data of the selected byte matches the specific content, the array column-address latch 104 keeps latching the column address that was being latched such that the array column address SADD is not updated.

In the page-programming method 300, the control unit 101 first verifies the data of a page that is going to be programmed and the memory cells in the non-volatile memory array 109 that are going to be programmed. After verifying, the control unit 101 then programs the data in the page register 111 to the corresponding memory cells in the non-volatile memory array 109. When the data of the page register 111 matches the specific content, the array column address SADD is latched by the array column-address latch 104. Namely, the array column address SADD is not replaced with the selected column address. Therefore, the non-ideal effect of a voltage drop on the gate voltage VH_Gate generated by the high-voltage generation circuit 102 due to fast-switching the array column address SADD can be prevented, and the time for re-programming due to the unstable gate voltage VH_Gate can be reduced, such that the program speed and stability of the non-volatile memory array is improved.

Since the byte-programming method 200 and the page-programming method 300 provided herein are configured to prevent the current consumption caused by the high-voltage signal fast switching in the non-volatile memory array, the gate voltage VH_Gate generated by the high-voltage generation circuit 102 could be stable, such that it is not necessary to rise the manufacturing cost for higher driving capability of the high-voltage generation circuit 102 and preserving high-voltage recovery time. In addition, it is not necessary to repeatedly program the memory during fast page-programming, and the circuit performance is therefore improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A byte-programming method configured to program data from a page register to a non-volatile memory array, comprising:
    reading data of a selected byte in the page buffer and programming the data of the byte to memory cells corresponding to a selected column address in the non-volatile memory array;
    determining whether to update an array column address according to the selected column address, comprising:
        determining whether the data of the selected byte matches specific content;
        when the data of the selected byte matches the specific content, not updating the array column address; and
        when the data of the selected byte does not match the specific content, updating the array column address according to the selected column address; and
    determining whether the selected column address is a last column address.

2. The byte-programming method of claim 1, wherein the step of determining whether to update the array column address further comprises:
    when the data of the selected byte does not match the specific content, generating and programming back comparison data, wherein the step of generating and programming back the comparison data further comprises:
        reading data of the memory cells corresponding to the selected column address;
        comparing the data of the memory cells corresponding to the selected column address with the data of the selected byte to generate the comparison data; and
        programming the comparison data back to the selected byte; and
    determining whether the comparison data matches the specific content;
    wherein when the comparison data matches the specific content, determining whether the selected column address is the last column address.

3. The byte-programming method of claim 1, wherein the step of determining whether the selected column address is the last column address further comprises:
    when the selected column address is not the last column address, reading data of next selected byte in the page register and repeating the step of determining whether to update the array column address; and
    when the selected column address is the last column address, ending the byte-programming method.

4. The byte-programming method of claim 2, wherein the step of determining whether the comparison data matches the specific content further comprises:
    when the comparison data does not match the specific content, programming the memory cells corresponding to the selected column address according to the comparison data; and
    repeating the step of generating and programming back the comparison data.

5. The byte-programming method of claim 2, wherein when the selected byte or the comparison data matches the specific content and the selected column address is the last column address, stopping the byte-programming method.

6. A page-programming method configured to program data of a page stored in a page register to a non-volatile memory array, comprising:
    executing a verify process, wherein the verify process comprises:

reading the data of a selected byte in the page register and programming the data of the selected byte to memory cells corresponding to a selected column address in the non-volatile memory array;

determining whether the data of the selected byte matches specific content;

when the data of the selected byte does not match the specific content, updating an array column address according to the selected column address, reading data of the memory cells corresponding to the selected column address in the non-volatile memory array, comparing the data of the memory cells corresponding to the selected column address with the data of the selected byte to generate comparison data, and programming the comparison data back to the selected byte;

when the data of the selected byte matches the specific content, not updating the array column address; and determining whether the selected column address is the last column address, and determining whether all the comparison data corresponding to the page matches the specific content when the selected column address is the last column address; and when any one of the comparison data does not match the specific content, executing a program process.

7. The page-programming method of claim 6, wherein the program process comprises:

reading the selected byte once again;

determining once again whether the data of the selected byte matches the specific content;

when the data of the selected byte matches the specific content, not updating the array column address;

when the data of the selected byte does not match the specific content, updating the array column address and programming the memory cells corresponding to the selected column address according to the selected byte;

determining whether the selected column address is the last column address;

when the selected column address is not the last column address, repeating the program process from the step of reading data of next selected byte in the page register; and when the selected column address is the last column address, re-executing the verify process.

8. The page-programming method of claim 6, wherein the verify process further comprises:

when the selected column address is not the last column address, reading data of next selected byte in the page register; and when all the comparison data corresponding to the page matches the specific content, ending the page-programming method.

9. The page-programming method of claim 6, wherein when the selected byte or the comparison data matches the specific content and the selected column address is the last column address, ending the page-programming method.

* * * * *